United States Patent [19]  [11] 4,288,157
Brunner  [45] Sep. 8, 1981

[54] APPARATUS FOR CONTROLLING THE QUALITY OF A PICTURE WHICH IS TO BE PROCESSED IN A REPRAPPARATUS

[76] Inventor: Felix Brunner, Corippo, Switzerland

[21] Appl. No.: 22,243

[22] Filed: Mar. 20, 1979

Related U.S. Application Data

[63] Continuation of Ser. No. 756,562, Jan. 3, 1977, abandoned, which is a continuation of Ser. No. 447,621, Mar. 4, 1974, abandoned.

[30] Foreign Application Priority Data

Mar. 8, 1973 [CH] Switzerland ............................ 3437/73

[51] Int. Cl.³ ...................... G03B 27/52; G03B 27/32
[52] U.S. Cl. ......................................... 355/40; 355/77
[58] Field of Search ........................ 355/41, 40, 52, 77

[56] References Cited

U.S. PATENT DOCUMENTS

| 3,177,763 | 4/1965 | Franqui | 355/40 |
| 3,204,544 | 9/1965 | Shannon | 355/52 X |
| 3,220,301 | 11/1965 | Koonz et al. | 355/40 |
| 3,289,530 | 12/1966 | Samain | 355/77 X |
| 3,393,618 | 7/1968 | Baker | 355/77 UX |
| 3,508,826 | 4/1970 | Grabau | 355/40 X |
| 3,620,622 | 11/1971 | Goodwin | 355/77 X |
| 3,861,798 | 1/1975 | Kobayashi et al. | 355/77 X |

Primary Examiner—Donald A. Griffin
Attorney, Agent, or Firm—Ladas & Parry

[57] ABSTRACT

An apparatus for controlling the quality of a picture which is to be processed in a reproduction process, comprising a carrier and at least one measurement element applied to the carrier, said measurement element possessing at least one measurement symbol, the surface area of which is in a predetermined relationship with regard to the total surface area of the measurement element, and wherein the measurement symbol is subdivided into at least two non-contiguous parts or components or has a ring-shaped configuration. There is also disclosed a method of producing such apparatus wherein the measurement symbol is recorded in an enlarged scale and thereafter photographically reduced in size to the desired size.

21 Claims, 5 Drawing Figures

APPARATUS FOR CONTROLLING THE QUALITY OF A PICTURE WHICH IS TO BE PROCESSED IN A REPRAPPARATUS

CROSS-REFERENCE TO RELATED APPLICATION

This is a continuation of copending Application Ser. No. 756,562 filed Jan. 3, 1977 and now abandoned, which is itself a continuation of Application Ser. No. 447,621 filed Mar. 4, 1974 and now abandoned.

BACKGROUND OF THE INVENTION

The present invention relates to a new and improved apparatus for controlling the quality of a picture which is to be processed in a reproduction process, and also pertains to a method of producing such apparatus.

Original pictures normally show continuous tones. For example, paintings, photographs and slides are continuous tone originals. However, normal printing procedures are not able to reproduce continuous tones and screened prints are instead produced.

In order to arrive at a screened print from a continuous tone original, five principal steps are performed.

The first step is the production using color separation techniques of a continuous tone reproduction for each of the primary colors namely magenta, cyan and yellow. A fourth continuous tone reproduction is also normally produced, for the color black, in order to improve contrast. The continuous tone reproductions, which are continuous tone black-and-white transparencies, are produced using a reproduction camera or a contact printing method.

The second step is the screening of the three or four continuous tone reproductions. This screening is done using a reproduction camera in contact with a screening plate. The effect of this step is to produce, from the continuous tone reproductions, original screened films in which the continuous tones appear as half-tone dots. Generally, the screen dots produced in this second step are not sharp enough, and the third step is carried out in order to sharpen the dots.

In the third step, film contact of the original screened film is carried out to produce contact films.

In the fourth step, a printing plate is made from the contact films. In offset printing, the printing plate is normally metallic, and the metallic plate is covered with an emulsion which can be sensitized. The half-tone image carried by the contact films is transferred to the printing plate by a contact printing method using a very hard metal-halogen light. After exposure, the emulsion on the metallic plate is developed and finished, and the screen dots of the contact films are transferred to produce screen dots on the metallic plate.

In the final step, the printing plate is used in the printing press to produce screened prints.

The quality of screened prints obtained in a reproduction process such as that described above is influenced by different factors, such as resolution power, tone displacements, screen dot deformation, color layer thickness, grey balance. In order to be able to more readily control the complex operations which arise during performance of such process attempts have been made to render the individual influencing factors independent of the picture which is to be produced and to determine such separately.

It is known for this purpose to use control devices consisting of measuring of measurement symbols assembled together into a group. These control devices are transported externally of the actual pictures, however upon the same picture carrier, past one or a number of work stations of the reproduction process. In this way it is possible to separately determine the individual influencing factors independent of the picture subject, because there is known ahead of time the picture quality which is to be obtained of the measurement symbols of such control devices. From the changes in the measurement symbols of the control device which have been ascertained it is possible to draw conclusions concerning corresponding changes of the screen dots at the printing form and at the printed picture. Not only is there simplified the checking of the course of the reproduction- and printing process, but the control thereof is also thereby simplified and the quality of the picture which is to be produced is rendered more uniform.

In order to be able to obtain the data necessary for determining the different influencing factors in sufficient amounts, the control devices must possess a suitable construction and be distributed in sufficient numbers over the printing form. For practical reasons, the control devices are combined in a selected arrangement into so-called measurement strips, also known as measurement beams. Since the transport of the relevant control device i.e., the entire measurement beam as a general rule requires an increase in the necessary paper format and thus an additional expenditure in material, attempts have been made for reasons of economy to maintain, on the one hand, the control device, as small as possible and, on the other hand, to construct such that they can deliver as much data as possible.

Control devices are used for instance for visual, microscope and densitometric controls. Visually, if necessary with the aid of a magnifying glass and a microscope, there are evaluated on the basis of appropriate control devices the color superimposition, the grey balance, slurring and doubling, the increase in tone grade and the peak point tone grade. Densitometrically there are measured color density and tone displacements as a consequence of the deformation in the form of dots.

The control devices which have heretofore been employed and the thus employed measuring techniques possess a series of shortcomings and disadvantages:

1. Each of the control devices in a measurement beam was previously constructed for evaluating only a single characteristic. Therefore there were required a large number of different control devices in a measuring or measurement beam and such thus requires a greater amount of space.

2. For the densitometric measurement the control devices must possess a minimum size, determined by the measurement spot of the employed device. For each tone value stage there is thus required an additional control device with a larger number of equal size measurement symbols.

3. The measurements with a measurement microscope, although possessing the advantage of being able to get by with control devices of very small dimensions, in fact in some instances with individual measurement symbols, nonetheless possesses the drawback that for practical requirements it is much too inaccurate for screen stages of 20% to 80% surface coverage. The screen dots which exist during the standard screening of pictures generally possess shapes, the surface coverage of which is difficult to calculate.

SUMMARY OF THE INVENTION

Hence, it is a primary object of the present invention to overcome the aforementioned shortcomings and drawbacks present in the state-of-the art proposals.

Now in order to implement this object and others which will become more readily apparent as the description proceeds, the control apparatus or device of this invention is manifested by the features that it comprises a carrier and at least one measurement element which is applied at the carrier, this measurement element possessing at least one measurement symbol, the surface or surface area of which is in a predetermined relationship to the total surface or surface area of the measurement element. The measurement symbol is subdivided into at least two non-coherent i.e. non-interconnected contiguous parts or has a substantially ring-shaped configuration.

BRIEF DESCRIPTION OF THE DRAWING

The invention will be better understood and objects other than those set forth above, will become apparent when consideration is given to the following detailed description thereof. Such description makes reference to the annexed drawing wherein.

DETAILED DESCRIPTION OF THE PREFERRED EMBODIMENTS

Figure 1:
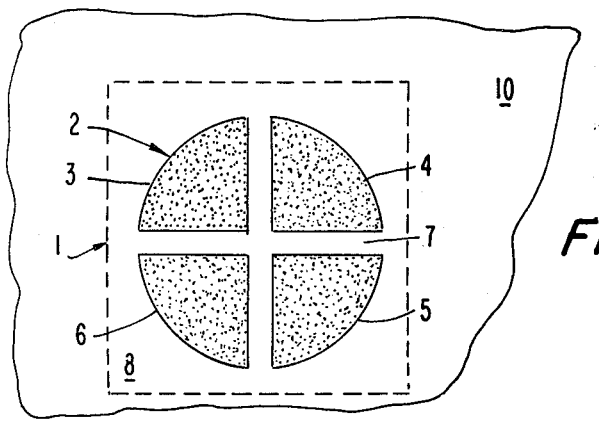
FIG. 1 illustrates a first form of a measurement or measuring symbol of the aforementioned control apparatus.

Describing now the drawing, the apparatus considered hereinafter will be understood to comprise a carrier or support 10 at which there is arranged at least one measurement or measurement element 1 (FIG. 1). This measurement element 1 possesses four partial segments or parts 3, 4, 5 and 6 which form a measurement or measuring symbol 2 having substantially the form of a screen dot. Between the segments 3, 4, 5 and 6 which are in spaced relationship i.e. non-contiguous or not interconnected there is located a recess 7 which, with the embodiment of measurement symbol 2 under discussion, possesses the shape of a cross.

A part of the measurement symbol 2 is also formed by a certain region 8 of the surrounding area of the measurement symbol 2 at the carrier 10, which can be of significance during evaluation of the shape or size of such measurement symbol 2.

If there is assumed that measurement symbol deformations occur uniformly in all directions during the production process, something which is normally the most commonplace situation which arises in practice, then it is to be expected that the surface elongation or enlargement of the segments 3-6 in the recess 7 will only become noticeable for such length of time until the contours of the segments touch, so that the recess 7 fills-out and consequently disappears. Disappearance of the recess 7 can be easily ascertained optically. With the disappearance of the recess having a known width, there can be concluded therefrom that the measurement symbol 2 has reached a certain dimension of the surface enlargement or in fact has exceeded such.

The recess of a measurement symbol, as already mentioned, can possess the shape of a cross, but also can be constructed to have the shape of a number or to be circular, linear or the like. In each case the shape of the recess is to be selected such that the deformation of a measurement symbol can be easily ascertained optically. The dimensions of the parts or components 3, 4, 5 and 6 of the corresponding measurement symbol are always in a predeterminable exactly known relationship to the dimensions of the relevant recess 7.

Figure 2:
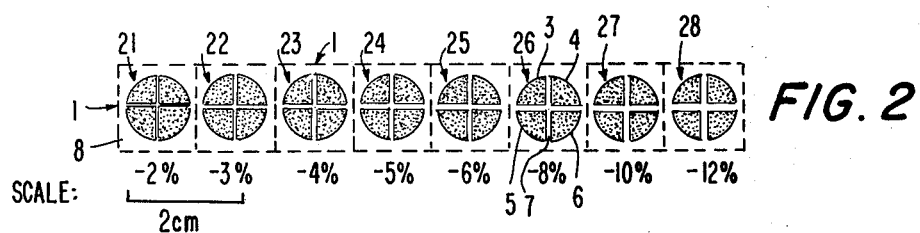
FIG. 2 illustrates measurement symbols according to the showing of FIG. 1 arranged as a scale.

It is advantageous to group together adjacent one another into a row a number of such type measurement elements 1 comprising symbols 21-28, as such has been illustrated in FIG. 2.

All measurement symbols 21-28 once again possess segments or parts 3-6, yet also recesses 7 which have the shape of a cross.

The legs of the hollowed-out or recessed cross at the first measurement symbol 21 have such a width that the contours or outlines of the segments, during an elongation or expansion of such segments which is uniform in all directions, during a 2% enlargement of the surface of the measurement symbol 21 touch at the recess, so that the recess is filled-out and disappears.

In FIG. 2 there are also illustrated the additional measurement symbols 22-28 provided with the recesses 7, and which correspond to an enlargement of these measurement symbols during the reproduction process of 3%, 4%, 5%, 6%, 8%, 10% and 12%. Such type row or arrangement of measurement symbols 21-28 then constitutes a scale.

The carrier or support of a picture which is to be processed in a reproduction process is provided externally of the surface occupied by such picture, for instance at the margin or edge, with the aforementioned scale, so that the carrier of the picture becomes the carrier 10 of the measurement element 1. During subsequent processing of the original both the points or dots of the picture as well as also the measurement symbols of the scale of the control device experience the same deformation of their shape and also their size respectively.

Upon reaching a certain amount of such deformation the recess at one of the measurement symbols 21-28 of the scale of the control device or apparatus disappears.

From the value of the known relationship between the original surface of the parts of a measurement symbol of the control device and the size of the recess at such measurement symbol, it is possible to then draw conclusions about the size of the enlargement of the screen dots of the reproduced picture.

The extent of the enlargement of the screen dots can be directly read-off at the control apparatus if there is marked or recorded adjacent the relevant measurement symbol the corresponding value of the screen dot enlargement, as such has been indicated in FIG. 2. It is then only necessary to determine at the relevant work or processing station of the reproduction operation at which measurement symbols the recesses have disappeared and at which they are still visible. The change in the surface of the screen dots of the reproduced picture are then located some where therebetween, and it is possible to simply read the value thereof from the markings provided at the control apparatus.

The just described control apparatuses are particularly intended for visual evaluation of the screen dot deformation at the picture.

For combined densitometric and visual evaluation of the screen dot deformation there can be employed a further type of control apparatus or device.

With such control apparatus the relevant measurement symbol consists of a pair of surface-like different divider points or dots which however complement one another to a predetermined surface covering or coverage of the relevant measurement element. The contour of the content or portions imprinted within a measurement element, during the reproduction thereof, also experience an enlargement. This renders possible the aforementioned combined evaluation of the scale in order to be able to reach a greater number of conclusions about the quality of the reproduction- and printing process.

Figure 3:
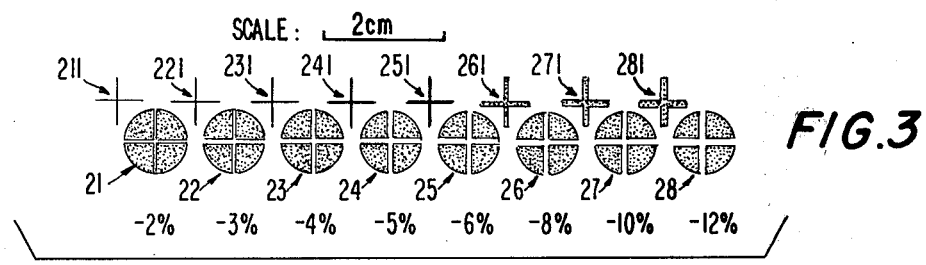
FIG. 3 illustrates the scale of FIG. 2 but supplemented by further measurement of measuring symbols.

Hence, for this purpose the aforedescribed row of recessed measurement symbols 21 to 28 which have been illustrated in FIG. 2 can be supplemented by the further measurement symbols 211, 221, 231, 241, 251, 261, 271, 281, as illustrated in FIG. 3.

These supplementing or secondary measurement symbols 211 to 281 possess the shape of a cross. The surface or surface area of each such cross is equal to the surface or surface area of the recess at the corresponding recessed measurement symbol which is associated therewith. At each measurement element 1 the mutually supplementing or complementing measurement symbols, for instance the measurement symbols 21 and 221, cover 50% of the surface or surface area of a measurement element 1. Since the measurement elements are again arranged in a row, they likewise form a scale, i.e. a control field, wherein at such control field all measurement elements always exhibit a 50% coverage of the surface of the carrier thereof.

The complementary or supplementary positive crosses 211 to 281 therefore serve for the surface compensation of the recesses at the recessed measurement symbols and also for the control of the reduction in size of the screen dots of the picture which is to be processed in each case.

Figure 4:
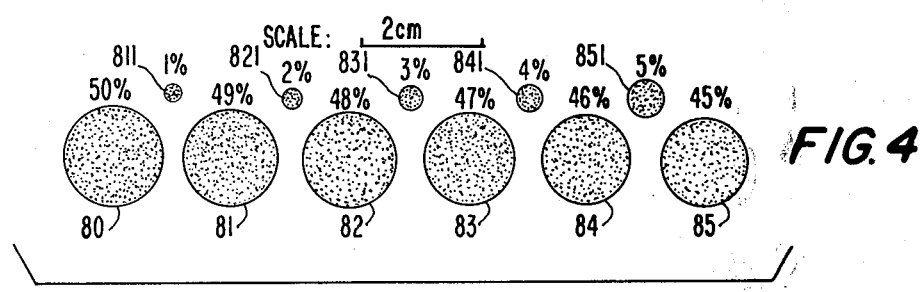
FIG. 4 is a scale consisting of measurement symbols of a different form.

FIG. 4 illustrates a further example of the control apparatus or device for a combined visual and densitometric measurement of the screen stage with 50% surface coverage. There are provided pairs of circular and adjacently arranged measurement symbols 80, 81, 82, 83, 84, 85 and 811, 821, 831, 841, 851, which mutually complement or supplement one another to 50% of the surface coverage of the relevant measurement element; 49%, 1%, 48%, 2%, 47%, 3%, 46%, 4%, 45%, 5%.

The positive measurement symbols 811 to 851 serve the same purpose as the positive crosses 221-281.

Figure 5:
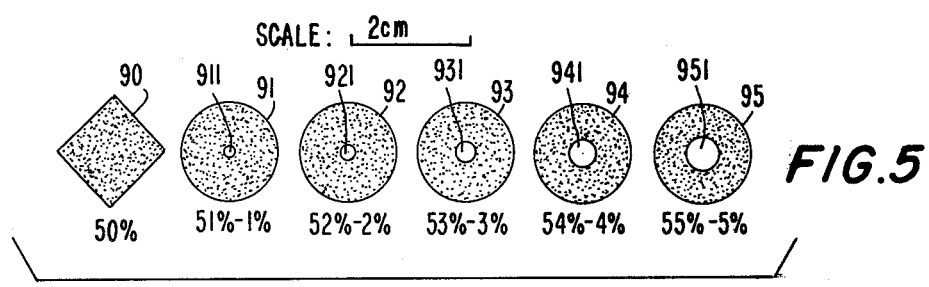
FIG. 5 is a scale consisting of measurement symbols and possessing still further advantageous forms.

In FIG. 5 there is illustrated still a further embodiment of the inventive control apparatus or device, wherein the relevant measurement element once again contains a circular or round measurement symbol 91, 92, 93, 94 and 95, however the measurement symbols possess round or circular recesses 911, 921, 931, 941 and 951.

The recessed measurement symbols 91 to 95 "supplement" or "complement" themselves with the "negative" measurement symbols 911 to 951 to a 50% surface covering or coverage of the relevant measurement element, as was the case for the control apparatus according to FIG. 4.

The aforementioned complementation is, however, in this case substructive and can be expressed as follows: 51%, −1%; 52%, −2%; 53%, −3%; 54%, −4%; 55%, −5%.

The measurement symbols also can possess an elliptical, rhomboid-shaped, square or barrel-shaped configuration. In FIG. 5 there is shown, by way of example, a square measurement symbol 90. This measurement symbol 90 likewise covers 50% of the surface of a measurement element in which it lies.

Due to these constructional shapes of the inventive control apparatus there can be attained the result that in a scale intended for densitometric evaluation, there can be additionally incorporated measurement symbols of random size for the visual evaluation of the prints, without impairing the densitometric control. The thus realized advantage resides in the fact that with this control apparatus it is not only possible to control a single screen dot size, but at the same time a number of such.

The individual measurement symbols of 1% to 5%, irrespective of whether such are positive or negative as well as of 45%–49% and 51%–55% are suitable for visual control with the aid of a magnifying glass or a microscope, whereas the total control field is suitable for the densitometric measurement of the stage of 50% surface coverage.

With the simplest evaluation of the described control field, there is checked the presence of the peak or sharpened points, which are particularly critical, because they have the tendency of disappearing during the different working phases of the reproduction-and printing operation. Under the terms "peak or sharpened points" there is to be understood the finest measurement symbols with a surface coverage up to 10%, positive or negative respectively. Due to the disappearance of the peak points, there can be drawn conclusions regarding the absence of the corresponding tone scale at the picture.

A further evaluation of the control field is realized in that there is checked whether the peak points or sharpened points during the recopying processes disappear at the positive and negative regions at the same stage, for instance at the 2% surface coverage or covering. This evaluation provides, for recopying processes, the optimum working conditions for attaining the longest tone grade scale, which again is important for the picture quality which is sought.

The measurement symbols illustrated in FIGS. 2 to 5 are shown about 120 times larger in size than would be the case in a control scale used in practise, and the enlarged showing has been made simply for purposes of clarifying the illustration and for better understanding the disclosure of the invention.

Thus, in practice the symbols illustrated in FIGS. 2 and 3 would be about 83 microns in diameter and the symbols illustrated in FIGS. 4 and 5 would be about 133 microns in diameter.

Since the required arrangement, combination and forming of measurement symbols only can be influenced to a limited extent with conventional screening techniques, they are therefore not suitable for producing the aforementioned control devices. Consequently, there will be described hereinafter a technique for producing the aforedescribed control devices.

This process is based upon the fact that measurement symbols can be recorded or plotted with an enlargement of 100-fold to 1000-fold, and thereafter they can be photographically reduced in size to the desired size. For this purpose there are employed cameras and objectives with extreme reduction factors and very good line sharpness. The accuracy of the reduction in size, which is dimensionally true, must be in the order of 1 micron. The employed photographic layers should reach a resolution power or capacity of at least 1000 lines per millimeter.

While there is shown and described present preferred embodiments of the invention, it is to be distinctly understood that the invention is not limited thereto, but may be otherwise variously embodied and practiced within the scope of the following claims. ACCORDINGLY,

What is claimed is:

1. An apparatus for use in checking the quality of a screened print, consisting of screen dots, which occupies a predetermined area of a carrier member, said apparatus comprising at least one measurement element which is applied to the carrier member outside said predetermined area, said measurement element including at least one measurement symbol which is of substantially the same overall shape as one of the screen dots forming the screened print and the size of which is of the same order of magnitude as the size of one of the screen dots forming the screened print, said symbol having an external periphery and being formed with a gap which is located within the external periphery of the symbol and disappearance of which during reproduction of printing of an image formed by the screen dots within said predetermined area represents directly a measure of a departure of the screen dots from the desired shape or size thereof.

2. An apparatus as claimed in claim 1, wherein the gap possesses a cross-like configuration.

3. An apparatus as claimed in claim 1, wherein the gap extends linearly.

4. An apparatus as claimed in claim 1, wherein a number of measurement elements are arranged in a row, and the width of the gap of the measurement symbol of one measurement element is smaller than the width of the gap of the measurement symbol of a neighboring measurement element.

5. A method of controlling the production of a screened print, consisting of screen dots, which occupies a predetermined area of a carrier member, said method comprising the steps of applying at least one measurement element to the carrier member outside said predetermined area, said measurement element including a primary measurement symbol which is of substantially the same shape as one of the screen dots forming the screened print and a secondary measurement symbol which is substantially circular, the size of said primary measurement symbol being of the same order of magnitude as the size of said screen dots, and examining the measurement symbols after a step in the production of the screened print has taken place in order to check whether the symbols were deformed during the production step.

6. An apparatus for use in checking the quality of a screen print when reproducing or printing an image which occupies a predetermined area of a carrier member, having at least one measurement element comprising at least one measurement symbol which allows conclusions to be drawn relating to changes of said image when being reproduced or printed, wherein said measurement symbol (2; 21-28; 91-95) has an external periphery and is formed in such a manner that the disappearance of one part (7; 911-951) of said measurement symbol, which part is located within the external periphery of the symbol, represents directly the measure of a relative increase of the area of the screen dots forming the image.

7. An apparatus as claimed in claim 6, wherein said measurement symbol comprises a cut-out forming a disappearing part (7; 911-951) whereby a disappearing of said cut-out represents a measure of said relative increase of the screen dots.

8. An apparatus as claimed in claim 7, wherein said cut-out extends linearly and it is formed as a gap or distance between two parts of a measurement symbol.

9. An apparatus as claimed in claim 7, wherein said cut-out possesses a cross-like configuration.

10. An apparatus as claimed in claim 6, wherein a number of measurement symbols (21-28; 91-95) having cut-outs of different size and a number of pairs of measurement symbols (21-28; 211-281; 80-85; 811-851), the second measurement symbols of which are of different sizes, are arranged in a row and form a measurement strip.

11. An apparatus as claimed in claim 10, wherein all measurement symbols (91-95) or all pairs of measurement symbols (21-28; 211-281; 80-85; 811-851) cover the same area.

12. An apparatus for use in checking the quality of a screened print, consisting of screen dots, which occupies a predetermined area of a carrier member, said apparatus comprising at least one measurement element which is applied to the carrier member outside said predetermined area, said measurement element including at least one measurement symbol which is of substantially the same overall shape as one of the screen dots forming the screened print and the size of which is of the same order of magnitude as the size of one of the screen dots forming the screened print and which is formed with a gap possessing a round configuration.

13. An apparatus for use in checking the quality of a screened print, consisting of screen dots, which occupies a predetermined area of a carrier member, said apparatus comprising a number of measurement elements which are applied to the carrier member in a row outside said predetermined area, each said measurement element including at least one measurement symbol which is of substantially the same overall shape as one of the screen dots forming the screened print and the size of which is of the same order of magnitude as the size of one of the screen dots forming the screened print and which is formed with a gap, the width of the gap of the measurement symbol of one measurement element being smaller than the width of the gap of the measurement symbol of a neighboring element in said row, and each measurement element including, in addition to the measurement symbol which is of substantially the same overall shape as one of the screen dots forming the screened print, a secondary measurement symbol which is of substantially the same overall shape and size as the gap in the first-mentioned measurement symbol, and wherein the combined area of the first measurement symbol of said neighboring measurement element, excluding the gap thereof, and the second measurement symbol of said neighboring measurement element is equal to the combined area of the measurement symbol having the smaller gap, excluding the area of said smaller gap, and the secondary measurement symbol of the measurement element including said measurement symbol having the smaller gap.

14. An apparatus for use in checking the quality of a screened print, consisting of screen dots, which occupies a predetermined area of a carrier member, said apparatus comprising at least one measurement element which is applied to the carrier member outside said predetermined area, said measurement element including at least a pair of measurement symbols of different respective sizes, one of said symbols being of substantially the same overall shape as the screen dots forming the screened print and the size of said one symbol being of the same order of magnitude as the size of said screen dots, and wherein said one measurement symbol is formed with a gap and the other measurement symbol of said pair is the same shape and size as said gap.

15. An apparatus as claimed in claim 14, wherein the gap possesses a cross-like configuration.

16. An apparatus for use in checking the quality of a screened print, consisting of screen dots, which occupies a predetermined area of a carrier member, said apparatus comprising a number of measurement elements which are applied to the carrier member outside said predetermined area, each said measurement element including at least a pair of measurement symbols of different respective sizes, one of said symbols of each measurement element being of substantially the same overall shape as the screen dots forming the screened print and the size of said one symbol being of the same order of magnitude as the size of said screen dots, and the area of the pair of measurement symbols of each measurement element being the same as the area of the pair of measurement symbols of each other measurement element.

17. An apparatus as claimed in claim 16, wherein the other measurement symbol of each of said pairs possesses a round configuration.

18. An apparatus for use in checking the quality of a screen print when reproducing or printing an image which occupies a predetermined area of a carrier member, having at least one measurement element comprising at least one measurement symbol which allows conclusions to be drawn relating to changes of said image when being reproduced or printed, wherein said measurement symbol (2; 21-28; 91-95) is formed in such a manner that the disappearance of one part (7; 911-951) of said measurement symbol represents directly the measure of a relative increase of the area of the screen dots forming the image, said measurement symbol comprising a cut-out possessing a round configuration and forming a disappearing part (7, 911-951) whereby a disappearing of said cut-out represents a measure of said relative increase of the screen dots.

19. An apparatus for use in checking the quality of a screen print when reproducing or printing an image which occupies a predetermined area of a carrier member, having at least one measurement element comprising at least one measurement symbol which allows conclusions to be drawn relating to changes of said image when being reproduced or printed, wherein said measurement symbol (2; 21-28; 91-95) is formed in such a manner that the disappearance of one part (7; 911-951) of said measurement symbol represents directly the measure of a relative increase of the area of the screen dots forming the image, and wherein beside each measurement symbol (21-28; 80-85) a second measurement symbol (221-281) is placed which is shaped as a complement to said first measurement symbol, so that said first (21-28; 80-85) and said second measurement symbols (221-228; 811-851) form a pair of measurement symbols whereby a disappearing of said second measurement symbol of one pair thereof represents a measure of a relative decrease of the area of the screen dots.

20. An apparatus as claimed in claim 19, wherein the measurement symbol (21-28) is comprising a cut-out (7) and wherein the second measurement symbol (211-281) has a size and shape the same as the size and shape of said cut-out (7).

21. An apparatus for use in checking the quality of a screen print when reproducing or printing an image which occupies a predetermined area of a carrier member, having a number of measurement elements arranged in a row and forming a measurement strip, each measurement element comprising first and second measurement symbols which allow conclusions to be drawn relating to changes of said image when being reproduced or printed, wherein said first measurement symbol (21-28; 91-95) of each measurement element is formed with a cut-out, the disappearance of which represents directly the measure of a relative increase of the area of the screen dots forming the image, the cut-outs of the first measurement symbols of the different measurement elements being of different respective sizes, and the second measurement symbols of the different measurement elements being of different respective sizes, the size of the cut-out of the first measurement symbol or the size of the second measurement symbol increasing from measurement element to measurement element along the row of measurement elements.

* * * * *